United States Patent
Hata

(10) Patent No.: US 10,915,065 B2
(45) Date of Patent: Feb. 9, 2021

(54) IMAGE FORMING APPARATUS EQUIPPED WITH FAN FOR COOLING A PLURALITY OF CIRCUIT BOARDS

(71) Applicant: CANON KABUSHIKI KAISHA, Tokyo (JP)

(72) Inventor: Fumie Hata, Kashiwa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/738,248

(22) Filed: Jan. 9, 2020

(65) Prior Publication Data

US 2020/0233376 A1 Jul. 23, 2020

(30) Foreign Application Priority Data

Jan. 18, 2019 (JP) ................................. 2019-007121

(51) Int. Cl.
*G03G 15/00* (2006.01)
*G03G 21/20* (2006.01)
*H05K 9/00* (2006.01)
*H05K 7/20* (2006.01)

(52) U.S. Cl.
CPC .......... *G03G 21/206* (2013.01); *G03G 15/80* (2013.01); *H05K 7/20145* (2013.01); *H05K 7/20172* (2013.01); *H05K 9/0026* (2013.01)

(58) Field of Classification Search
CPC .. G03G 21/206; G03G 15/80; H05K 7/20145; H05K 7/20172; H05K 9/0026
See application file for complete search history.

(56) References Cited

U.S. PATENT DOCUMENTS

| 7,558,060 B2* | 7/2009 | Kiyosumi | B41J 2/1408 165/80.3 |
| 8,004,838 B2* | 8/2011 | Yoshida | G03G 21/206 361/695 |
| 9,346,300 B2* | 5/2016 | Suzuki | B41J 11/002 |
| 2016/0070231 A1* | 3/2016 | Kobayashi | G03G 21/206 399/92 |

FOREIGN PATENT DOCUMENTS

JP 2017044986 A 3/2017

* cited by examiner

*Primary Examiner* — Hoang X Ngo
(74) *Attorney, Agent, or Firm* — Rossi, Kimms & McDowell LLP

(57) ABSTRACT

An image forming apparatus that efficiently cools two circuit boards with one fan. An AC input circuit board has an AC power supply voltage supplied thereto from a commercial power supply, and includes a drive circuit for driving a heater. A power supply circuit board has an AC voltage supplied thereto from the AC input circuit board, and includes a conversion circuit for converting the AC voltage to a DC voltage. A sheet metal having a tubular shape covers the power supply circuit board. A fan cools the power supply circuit board. A duct member is arranged in a manner overlapping the sheet metal and cooperates with part of a wall portion of the sheet metal to form a flow passage for cooling the AC input circuit board with wind generated by the fan.

5 Claims, 4 Drawing Sheets

IMAGE FORMING APPARATUS EQUIPPED WITH FAN FOR COOLING A PLURALITY OF CIRCUIT BOARDS

BACKGROUND OF THE INVENTION

Field of the Invention

The present invention relates to an image forming apparatus having a plurality of circuit boards.

Description of the Related Art

In general, an image forming apparatus includes a plurality of circuit boards. The image forming apparatus is provided with an AC input circuit board that is connected to a commercial power supply and supplies an AC voltage to loads of the apparatus, and a power supply circuit board that is connected to the AC input circuit board and, after converting an AC voltage to a DC voltage, supplies the DC voltage to loads and circuit boards of the apparatus.

From a viewpoint of noise suppression, to shorten AC wires connecting the AC input circuit board and the power supply circuit board, both the boards are disposed close to each other. To block radiation noise from the power supply circuit board, the power supply circuit board is sometimes covered with a sheet metal.

Further, electric components that generate large amounts of heat are disposed on the power supply circuit board, and hence it is known to arrange a fan so as to cool these electric components. For example, an image forming apparatus disclosed in Japanese Laid-Open Patent Publication (Kokai) No. 2017-44986 uses, to cool a power supply circuit board covered with a shielding sheet metal, part of the sheet metal for one side wall of an air duct, and thereby cools the power supply circuit board.

Electric components that generate large amounts of heat are also used in the AC input circuit board, and hence it is necessary to cool the AC input circuit board. However, if a fan for cooling the AC input circuit board is added, it is difficult to secure a space and this increases costs. On the other hand, if it is attempted to cool the AC input circuit board using a fan provided for the purpose of cooling the power supply circuit board, it is impossible to efficiently cool the AC input circuit board, for the reason that it is difficult to form a flow passage of cooling air due to obstruction of the sheet metal covering the power supply circuit board and like other reasons.

SUMMARY OF THE INVENTION

The present invention provides an image forming apparatus that efficiently cools two circuit boards with one fan.

The present invention provides an image forming apparatus comprising an image forming unit configured to form an image on a recording material, a heater configured to heat the image formed on the recording material to fix the image to the recording material, a first circuit board configured to generate a first AC voltage based on an AC power supply voltage supplied from a commercial power supply, and generate a second AC voltage based on the AC power supply voltage, wherein the first AC voltage is used for supplying to the heater, a second circuit board configured to convert the second AC voltage to a DC voltage, wherein the DC voltage is used for supplying to the image forming unit, a shield member is formed into a tubular shape, and covers the second circuit board, a fan for cooling the second circuit board, and a duct member that is arranged in a manner overlapping the shield member, and cooperates with part of a wall portion of the shield member to form a flow passage for cooling the first circuit board with wind generated by the fan.

According to the present invention, it is possible to efficiently cool two circuit boards with one fan.

Further features of the present invention will become apparent from the following description of exemplary embodiments (with reference to the attached drawings).

DESCRIPTION OF THE EMBODIMENTS

The present invention will now be described in detail below with reference to the accompanying drawings showing embodiments thereof.

Figure 1:
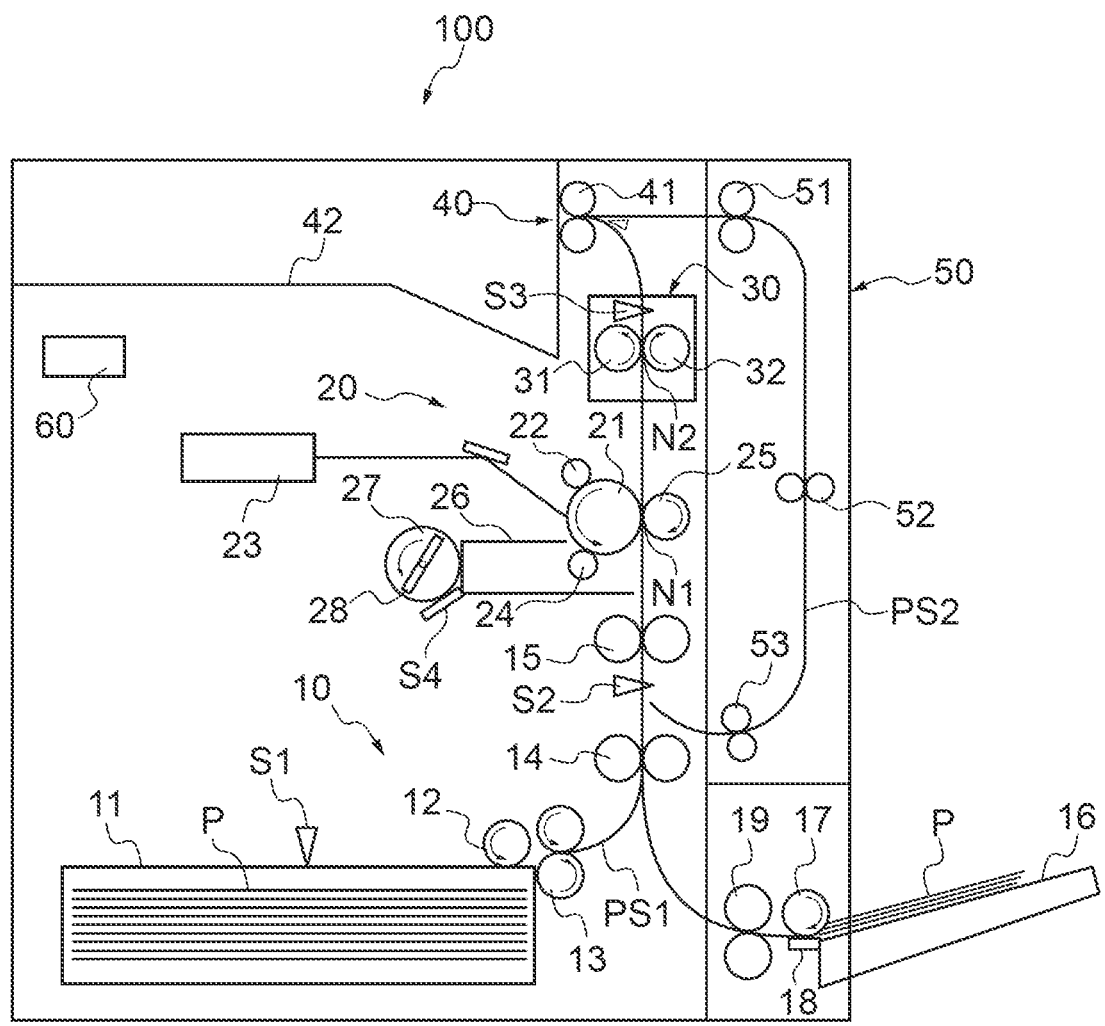
FIG. 1 is a schematic cross-sectional view of an image forming apparatus.

FIG. 1 is a schematic cross-sectional view of an image forming apparatus according to an embodiment of the present invention. This image forming apparatus, denoted by reference numeral 100, is a monochrome image forming apparatus using an electrophotographic method. However, the image forming apparatus to which the present invention is applied may be any of image forming apparatuses, including a color image forming apparatus, and those called as a multi-function peripheral, a copy machine, and a facsimile machine. FIG. 1 shows the image forming apparatus 100, as viewed from the front. In the following description, the directions of the image forming apparatus 100 are defined such that a direction toward the left, a direction toward the right, a direction toward the near side, and a direction toward the far side, as viewed from the front, are referred to as a positive X direction, a negative X direction, a positive Z direction, and a negative Z direction, respectively, and an upward direction and a downward direction are referred to as a positive Y direction and a negative Y direction, respectively.

The image forming apparatus 100 is provided with a recording material-feeding section 10, an image forming section 20 (image forming unit), a fixing section 30 (fixing unit), and a recording material-discharging section 40, which are arranged in the mentioned order from an upstream side of the direction of conveying a recording material P. Further, a recording material-refeeding section 50 is arranged on a right side part of the image forming apparatus 100. A controller 60 controls the operation of each component to form an image on a recording material P. In the recording material-feeding section 10, recording materials P stacked on a feed cassette 11 or a manual feed tray 16 are conveyed to the image forming section 20. A recording material detection sensor S1 detects whether or not there is any recording material P stored in the feed cassette 11. Each of recording materials P stored in the feed cassette 11 is conveyed toward a separation roller pair 13 by rotation of a pickup roller 12. In a case where multiple feed of recording materials P has occurred, the recording materials P are separated by the separation roller pair 13, formed by a normal rotation roller and a reverse rotation roller, one by one, and each uppermost recording material P is conveyed to a feeding path PS1, indicated by a solid line. The recording material P conveyed into the feeding path PS1 is further conveyed by a feeding roller pair 14, and skew of the recording material P is corrected by causing the front edge of the recording material P to extend along a nip of a resist roller pair 15 whose rotation is stopped.

A resist roller front sensor S2 detects a timing at which the front edge of the recording material P reaches the nip of the resist roller pair 15. In a case where the recording materials P are fed from the manual feed tray 16, a supply roller 17 and a separation pad 18 separate the recording materials P, one by one, and draw each recording material P into the apparatus. Then, the recording material P is conveyed toward the feeding roller pair 14 by a supply roller pair 19, and skew of the recording material P is corrected by the resist roller pair 15. The recording material P, whose skew has been corrected, is conveyed to the image forming section 20 by the resist roller pair 15 which are rotated at a predetermined timing. In the image forming section 20, a surface of a photosensitive drum 21 is uniformly charged by a charge roller 22. A laser light corresponding to image information is irradiated from a laser unit 23. Note that the laser light irradiated from the laser unit 23 is controlled based on image data transmitted from the outside. Electric charge charged by the charge roller 22 is removed from part of the photosensitive drum 21 onto which the laser light has been irradiated, whereby an electrostatic latent image corresponding to the image information is formed there. The electrostatic latent image thus formed is developed with developer attached by a developing roller 24, whereby it is visualized as a developer image.

The developer stored in a container 27 is supplied to a developing device 26 by rotating a stirring member 28 in the container 27. A developer detection sensor S4 detects an amount of the developer in the container 27. The visualized developer image is conveyed to a transfer nip N1 by rotation of the photosensitive drum 21. The recording material P is conveyed to the transfer nip N1 from the resist roller pair 15 in synchronism with this timing. The recording material P conveyed to the transfer nip N1 is nipped and conveyed by a transfer roller 25 brought into contact with the photosensitive drum 21, and the developer image formed on the photosensitive member 21 is transferred onto the recording material P by the transfer roller 25.

Next, the recording material P on which the developer image has been formed is conveyed to the fixing section 30. The fixing section 30 has a fixing nip N2 formed by a fixing roller 31 and a pressure roller 32. The fixing roller 31 is formed by an aluminum roller containing a heater. Note that the fixing section 30 has a thermistor, not shown, for detecting a surface temperature of the fixing roller 31, and a voltage (or electric current) input to the heater is controlled such that the temperature of the thermistor is held at a predetermined temperature. The pressure roller 32 is brought into contact with the fixing roller 31 to press the fixing roller 31 with a predetermined pressure. The recording material P on which the developer image has been formed is sent into the fixing nip N2, and is nipped and conveyed by the fixing roller 31 and the pressure roller 32, to be heated and pressed, whereby the developer image is fixed to the recording material P. A fixing sensor S3 detects that the front edge of the recording material P has passed the fixing nip N2. Note that an on-demand fixing method may be used for the fixing section 30. The recording material P to which the developer image has been fixed is conveyed to the recording material-discharging section 40 and is discharged onto a discharge tray 42 by a discharge roller pair 41.

In a case where images are formed on both sides of the recording material P, after the front edge of the recording material P having an image formed on its first side has passed the fixing sensor S3, the image forming apparatus 100 temporarily stops the discharge roller pair 41 before a rear edge of the recording material P passes through the discharge roller pair 41. Then, the image forming apparatus 100 causes the discharge roller pair 41 to be turned in an opposite direction, whereby the recording material P is reversed and conveyed into the recording material-refeeding section 50. The recording material P conveyed into the recording material-refeeding section 50 is conveyed along a refeeding path PS2 by refeeding roller pairs 51 and 52 and is conveyed to the resist roller pair 15 by a refeeding roller pair 53. Then, the recording material P is conveyed, after its skew has been corrected by the resist roller pair 15, to the transfer nip N1, where a developer image is formed on the second side of the recording material P. After that, similar to the operation performed when the image has been formed on the first side, the developer image is fixed to the recording material P by conveying the recording material P through the fixing nip N2. The recording material P having the images formed on the both sides is discharged onto the discharge tray 42 by the discharge roller pair 41.

Figure 2:
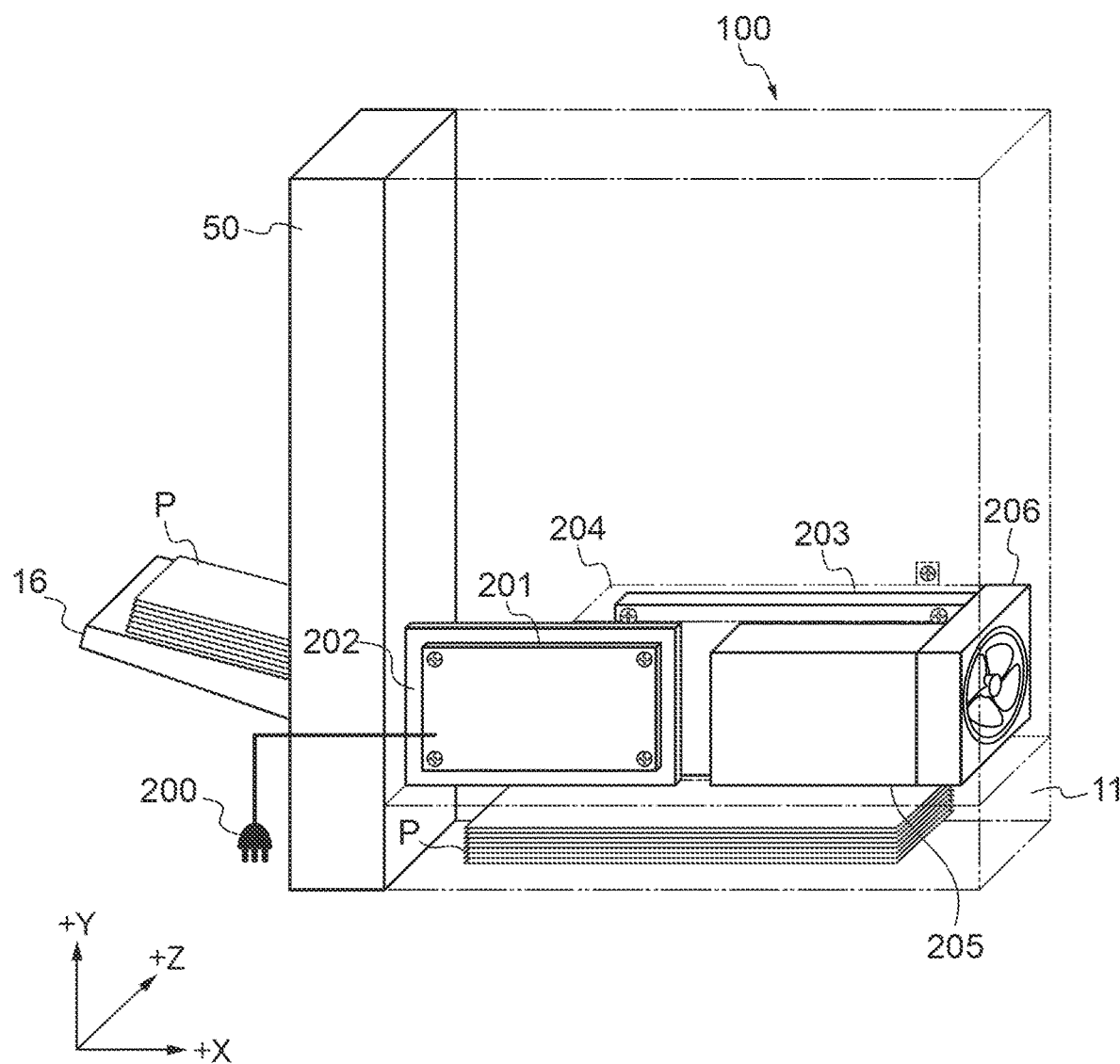
FIG. 2 is a schematic perspective view of a rear side of the image forming apparatus.

FIG. 2 is a schematic perspective view of a rear side of the image forming apparatus 100. FIG. 2 shows the image forming apparatus 100 such that the inside thereof is viewable so as to explain the arrangement of circuit boards. FIG. 2 shows, as essential component elements, an AC input circuit board 201 (first circuit board), a frame 202, a power supply circuit board 203 (second circuit board), a sheet metal 204 (shield member), a duct member 205, a cooling fan 206, and so forth.

In a lower part of the rear side (negative side of the Z direction) of the image forming apparatus 100, the AC input circuit board 201, the power supply circuit board 203, the duct member 205, and the cooling fan 206 are arranged. The AC input circuit board 201 is connected to a commercial power supply 200 and has an AC power supply voltage supplied from the commercial power supply 200. Further, the AC input circuit board 201 generates an AC voltage (first AC voltage) based on the supplied AC power supply voltage, and includes a drive circuit for driving the heater based on the AC voltage. Further, the AC input circuit board 201 generates an AC voltage (second AC voltage) based on the supplied AC power supply voltage, and supplies the AC voltage to various circuit boards including the power supply circuit board 203. The AC input circuit board 201 is mounted on the frame 202.

The power supply circuit board 203 has electric power supplied thereto from the AC input circuit board 201. That is, the power supply circuit board 203 receives the AC voltage using AC wires (power supply line) connected to the AC input circuit board 201, converts the AC voltage to a DC voltage using a conversion circuit, and supplies the converted DC voltage to motors and the various circuits for operation thereof. Note that the AC wires connecting between the power supply circuit board 203 and the AC input circuit board 201, and electric components, etc., arranged on the circuit boards, are omitted from illustration. To suppress noise generated from the power supply circuit board 203, the power supply circuit board 203 is covered with the sheet metal 204 for the shielding purpose. The power supply circuit board 203 is provided with switching devices, integrated circuits, and so forth, which generate large amounts of heat, and hence it is necessary to cool these switching devices and integrated circuits. Further, similar to the power supply circuit board 203, the AC input circuit board 201 is also provided with a bidirectional thyristor, and so forth, which generate large amounts of heat, and hence it is necessary to cool these devices. As described in detail hereinafter, the cooling fan 206 is provided to cool the power supply circuit board 203 and the AC input circuit board 201. Note that the AC input circuit board 201 and the power supply circuit board 203 both include respective heat sinks for efficiently cooling the electric components.

Figure 3:
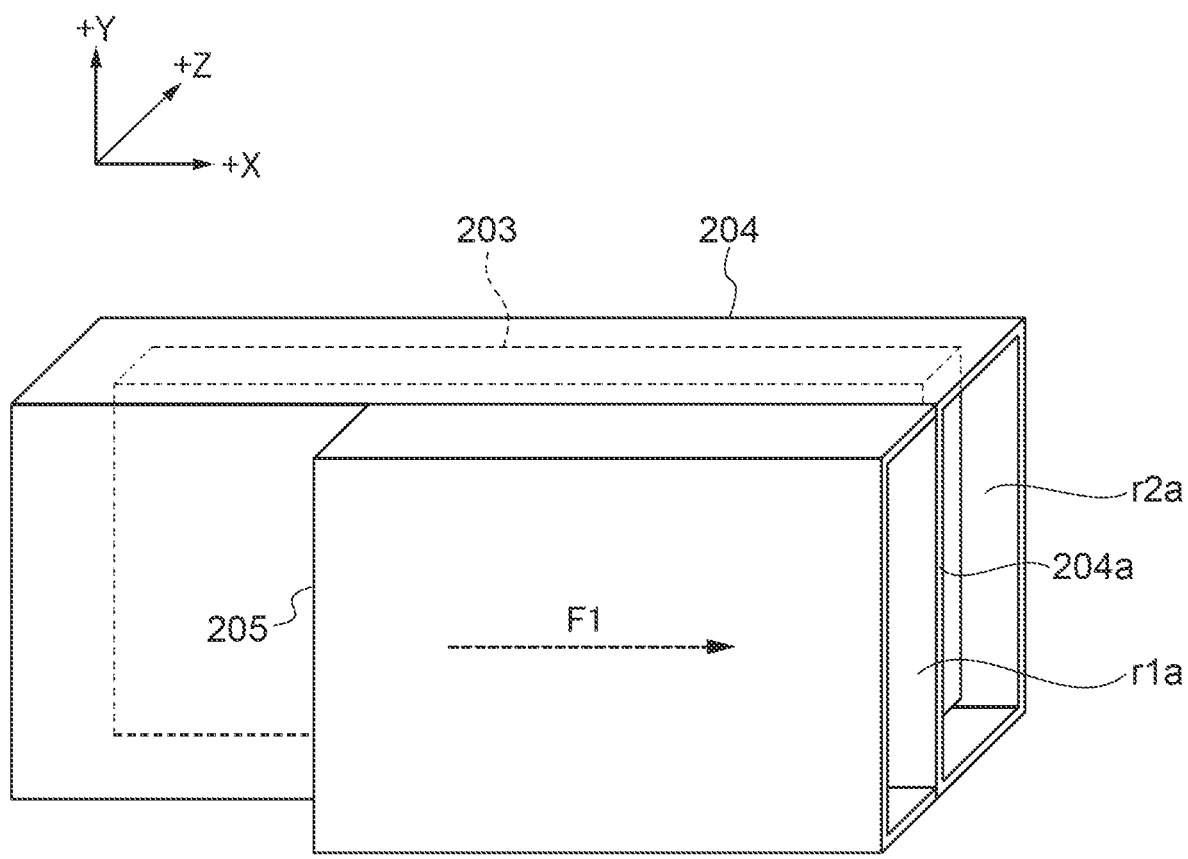
FIG. 3 is a schematic perspective view of a power supply circuit board, a sheet metal, and a duct member.
Figure 4:
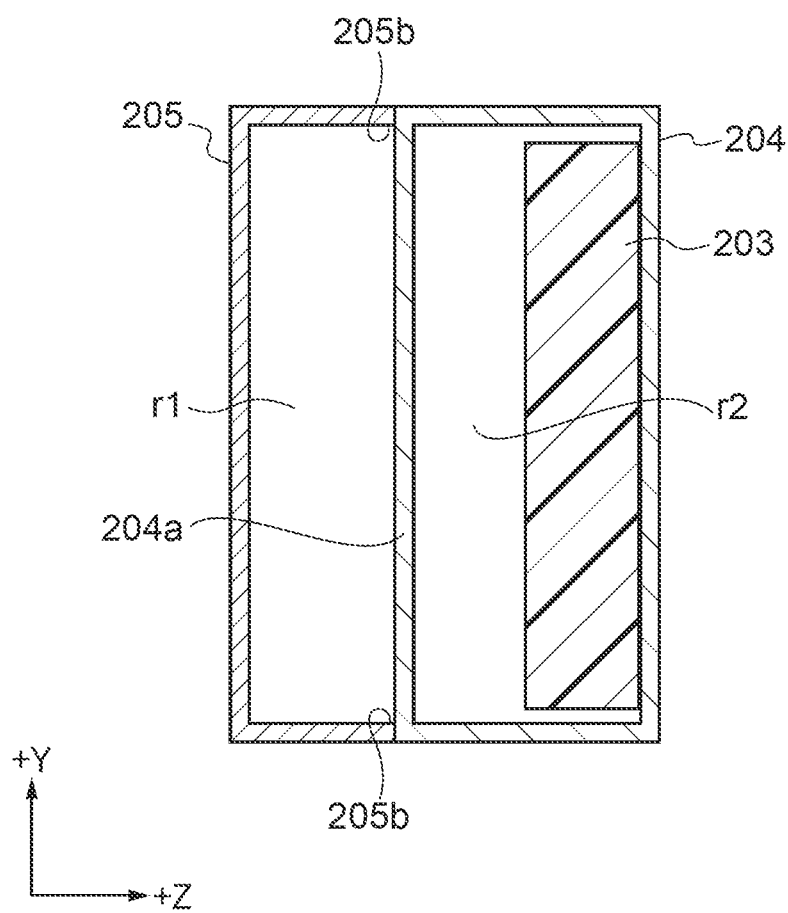
FIG. 4 is a schematic vertical cross-sectional view of the power supply circuit board, the sheet metal, and the duct member.

Next, the duct member 205 and the sheet metal 204 will be described in detail. FIG. 3 is a schematic perspective view of the power supply circuit board 203, the sheet metal 204, and the duct member 205. FIG. 4 is a schematic vertical cross-sectional view of the power supply circuit board 203, the sheet metal 204, and the duct member 205, shown in FIG. 3

The sheet metal 204 is formed into a tubular shape having a hollow part extending therethrough in the X direction (see FIGS. 3 and 4). The power supply circuit board 203 is accommodated in the hollow part of the sheet metal 204. The AC input circuit board 201 is disposed on a front side (negative side of the Z direction) of the sheet metal 204 and the power supply circuit board 203 (see FIG. 2). The AC input circuit board 201 and the power supply circuit board 203 both extend in the X direction as the longitudinal direction and are arranged in substantially parallel to each other. The sheet metal 204 and the AC input circuit board 201 at least partially overlap each other, as viewed from a direction of the thickness of the AC input circuit board 201 (Z direction), and further, the AC input circuit board 201 and the power supply circuit board 203 at least partially overlap each other.

As shown in FIGS. 3 and 4, the duct member 205 has a substantially U-shaped (or substantially C-shaped) cross section. The duct member 205 has a front opening 205*b* which opens toward the near side (positive side of the Z direction) as viewed in FIG. 1. The duct member 205 is arranged in a manner overlapping a side of the sheet metal 204 on the negative side of the Z direction. That is, the duct member 205 and the sheet metal 204 at least partially overlap each other, as viewed from the Z direction. The front opening 205*b* of the duct member 205 is closed by a side wall 204*a* of the sheet metal 204 on the negative side of the Z direction. With this, as shown in FIG. 4, the duct member 205 and part of the wall portion (side wall 204*a*) of the sheet metal 204 cooperate to form a flow passage r1. On the other hand, the power supply circuit board 203 is arranged within the sheet metal 204 at a location on the positive side of the Z direction. As a result, a flow passage r2 (another flow passage) is formed within the hollow part of the sheet metal 204 at a location on the negative side of the power supply circuit board 203 in the Z direction (see FIG. 4). That is, the flow passage r1 and the flow passage r2 are formed on opposite sides of the side wall 204*a* in the Z direction.

The power supply circuit board 203 is positioned in the flow passage r2. Therefore, the flow passage r2 is an air passage for cooling the power supply circuit board 203. On the other hand, the AC input circuit board 201 is located on an extension of the flow passage r1. Therefore, the flow passage r1 is an air passage for cooling the AC input circuit board 201 with wind generated by the cooling fan 206. Note that it is only required to arrange the heat sink of the AC input circuit board 201 on the extension of the flow passage r1. It is empirically known that if the heat sink is located on the extension of the flow passage r1, a sufficient cooling effect can be obtained even when the AC input circuit board 201 is not located on the extension of the flow passage r1.

In other words, the duct member 205 and the side wall 204*a* can be regarded to cooperate to form an air duct for cooling the AC input circuit board 201. That is, when the side wall 204*a* is regarded as part of an air duct for cooling the AC input circuit board 201, this air duct shares part of the wall surface (side wall 204*a*) with the sheet metal 204.

The cooling fan 206 is disposed at a location close to an opening r1*a* of the flow passage r1 (opening side; the positive side of the X direction). The cooling fan 206 sucks air around the AC input circuit board 201, and causes the sucked air to flow out of the image forming apparatus 100, by causing the same to flow through the duct member 205 (mainly the flow passage r1) and out from the opening r1*a*. With this, the AC input circuit board 201 is cooled. The wind generated by the cooling fan 206 flows in a direction F1 (positive X direction). Further, the cooling fan 206 sucks air from an opening of the flow passage r2 on the negative side of the X direction, and discharges the sucked air out of the image forming apparatus 100 by causing the same to flow through the flow passage r2 and out from an opening r2*a*. With this, the power supply circuit board 203 is cooled. Thus, the opening r1*a* of the flow passage r1 and the opening r2*a* of the flow passage r2 both function as the openings of the exhaust side. Note that the rotational direction of the cooling fan 206 may be made opposite to the above-mentioned example, and the generated wind may be made to flow in a direction opposite to the direction F1 (negative X direction).

Assuming that the AC input circuit board 201 and the power supply circuit board 203 are arranged orthogonally to each other, wasteful space is produced around the circuit boards, and hence it is impossible to make effective use of the space. What is worse, the length of the AC wires connecting the circuit boards is increased, which may affect noise. However, in the present embodiment, by arranging the AC input circuit board 201 and the power supply circuit board 203 in substantially parallel to each other, it is possible to form the efficient air flow passages using the duct member 205. Further, it is possible to shorten the length of the AC wires. It is possible to make the sizes of the cooling fan 206 and the duct member 205 smaller than those in a case where the AC input circuit board 201 and the power supply circuit board 203 are arranged on the same plane, which achieves space-saving.

The longitudinal direction of the duct member 205 is the X direction, which is the same as the flowing direction (direction F1) of the wind generated by the cooling fan 206. The duct member 205 is shorter than the sheet metal 204 in the X direction. This improves the workability of connecting connectors arranged on the AC input circuit board 201. Further, the cross-sectional area of the flow passage r1 and the cross-sectional area of the flow passage r2 are substantially equal to each other. Therefore, the wind generated by the cooling fan 206 is divided into the flow passage r1 and the flow passage r2. This makes it possible to cool the AC input circuit board 201 and the power supply circuit board 203 in parallel, with the one cooling fan 206. That is, it is possible to cool the AC input circuit board 201 by using the cooling fan 206 for cooling the power supply circuit board 203 without reducing the capability of cooling the power supply circuit board 203 as much as possible.

Note that if the viewpoint is limited to that of cooling the AC input circuit board 201, it is not necessarily required to make the duct member 205 shorter than the sheet metal 204 in the X direction, and further, the AC input circuit board 201 may be arranged within the duct member 205 (within the flow passage r1).

According to the present embodiment, the cooling fan 206 cools the power supply circuit board 203 via the flow passage r2 formed in the hollow part of the sheet metal 204. Further, the duct member 205 arranged in a manner overlapping the sheet metal 204 cooperates with part of the wall portion (side wall 204a) of the sheet metal 204 to form the flow passage r1 for cooling the AC input circuit board 201. The cooling fan 206 cools the AC input circuit board 201 via the flow passage r1. Therefore, it is possible to efficiently cool the two circuit boards (the power supply circuit board 203 and the AC input circuit board 201) with the one cooling fan 206.

Further, since the AC input circuit board 201 and the power supply circuit board 203 are substantially parallel to each other, it is possible to form the efficient air flow passages and reduce the length of the AC wires, and further, it is possible to achieve space-saving.

Further, since the duct member 205 is shorter than the sheet metal 204 in the X direction, the workability of connecting the connectors is improved. Furthermore, since the cross-sectional area of the flow passage r1 and the cross-sectional area of the flow passage r2 are substantially equal to each other, it is possible to uniformly cool the AC input circuit board 201 and the power supply circuit board 203.

Note that although the duct member 205 is formed into substantially the U-shape, this is not limitative, but the duct member 205 is only required to have a shape allowing cooperation with part of the wall portion of the sheet metal 204 to form a flow passage for cooling the AC input circuit board 201. Further, although the opening r1a of the flow passage r1 and the opening r2a of the flow passage r2 are flush with each other, the openings are not necessarily required to be flush with each other. That is, an end face of the duct member 205 on the positive side of the X direction and an end face of the sheet metal 204 on the positive side of the X direction are not necessarily required to be flush with each other.

Note that the present invention can be applied to an apparatus other than the image forming apparatus insofar as it is an electronic apparatus having a plurality of circuit boards.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-007121 filed Jan. 18, 2019, which is hereby incorporated by reference herein in its entirety.

What is claimed is:

1. An image forming apparatus comprising:
    an image forming unit configured to form an image on a recording material;
    a heater configured to heat the image formed on the recording material to fix the image to the recording material;
    a first circuit board that has a drive circuit, the drive circuit being configured to drive the heater based on an AC power supply voltage supplied from a commercial power supply;
    a second circuit board that has a conversion circuit, the conversion circuit being configured to convert the AC power supply voltage into a DC voltage to be supplied to the image forming unit;
    a fan that is rotationally driven;
    a first duct provided for cooling the first circuit board, inside of which air around the first circuit board suctioned by the fan flows through; and
    a second duct provided for cooling the second circuit board, inside of which air around the second circuit board suctioned by the fan flows through, wherein the second circuit board is arranged within the second duct,
    wherein, in a direction orthogonal to longitudinal direction of the second duct, a position of the first circuit board is different from a position of the second circuit board,
    wherein the first duct is arranged, in relation to the second duct, in the direction orthogonal to the longitudinal direction of the second duct,
    wherein the first duct is arranged between the first circuit board and the fan, and
    wherein a distance between the first circuit board and the fan is longer than a distance between the second circuit board and the fan.

2. The image forming apparatus according to claim 1, wherein the first duct is shorter than the the second duct in the longitudinal direction of the second duct.

3. The image forming apparatus according to claim 1, wherein the second duct suppresses noise generated from the second circuit board.

4. The image forming apparatus according to claim 1, wherein, in the longitudinal direction of the second duct, an area on which the first circuit board is arranged partially overlaps the second duct.

5. The image forming apparatus according to claim 1, wherein the second circuit board is electrically connected to the first circuit board via a power supply line.

* * * * *